United States Patent
Chang

(10) Patent No.: US 7,285,918 B2
(45) Date of Patent: Oct. 23, 2007

(54) ORGANIC LIGHT EMITTING DIODE DISPLAY AND FABRICATION METHOD THEREOF

(75) Inventor: Yi-Cheng Chang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 119 days.

(21) Appl. No.: 11/111,286

(22) Filed: Apr. 21, 2005

(65) Prior Publication Data

US 2005/0280373 A1    Dec. 22, 2005

(30) Foreign Application Priority Data

Jun. 17, 2004    (TW) ................................ 93117471 A

(51) Int. Cl.
*G09G 3/10* (2006.01)

(52) U.S. Cl. ..................... 315/169.3; 313/513; 313/505

(58) Field of Classification Search ... 315/169.2–169.4
See application file for complete search history.

(56) References Cited

U.S. PATENT DOCUMENTS

| | | | |
|---|---|---|---|
| 5,821,692 A * | 10/1998 | Rogers et al. | 313/512 |
| 6,232,142 B1 * | 5/2001 | Yasukawa | 439/69 |
| 6,265,820 B1 | 7/2001 | Ghosh et al. | 313/483 |
| 6,439,731 B1 * | 8/2002 | Johnson et al. | 362/29 |
| 6,706,544 B2 * | 3/2004 | Yamazaki et al. | 438/30 |
| 7,109,520 B2 * | 9/2006 | Yu et al. | 257/40 |
| 2002/0036604 A1 * | 3/2002 | Yamazaki et al. | 345/76 |
| 2002/0125803 A1 * | 9/2002 | Seki | 313/47 |
| 2003/0123706 A1 * | 7/2003 | Stam et al. | 382/104 |
| 2004/0119397 A1 * | 6/2004 | Sakamoto | 313/495 |
| 2005/0077615 A1 * | 4/2005 | Yu et al. | 257/706 |
| 2005/0224214 A1 * | 10/2005 | Zeighami et al. | 165/104.21 |
| 2006/0038501 A1 * | 2/2006 | Koyama et al. | 315/169.3 |
| 2006/0125364 A1 * | 6/2006 | Takeda et al. | 313/46 |
| 2006/0262241 A1 * | 11/2006 | Jeong | 349/58 |

* cited by examiner

*Primary Examiner*—Trinh Vo Dinh
(74) *Attorney, Agent, or Firm*—Thomas, Kayden, Horstemeyer & Risley

(57) ABSTRACT

Organic light emitting diode (OLED) displays and fabrication methods thereof are provided. The OLED display comprises a substrate having a display area and a peripheral area. An array of pixels is disposed in the display area. Column and row control circuits are disposed in the peripheral area. At least one thermal dissipation element is disposed in the peripheral area connecting each pixel.

17 Claims, 2 Drawing Sheets

ORGANIC LIGHT EMITTING DIODE DISPLAY AND FABRICATION METHOD THEREOF

This application claims the benefit of Taiwan application Serial No. 93117471, filed Jun. 17, 2004, the subject matter of which is incorporated herein by reference.

BACKGROUND

The invention relates to organic light emitting diode (OLED) displays, and more particularly, to active matrix organic light emitting diode (AM-OLED) displays with thermal dissipation elements and fabrication methods thereof.

Among flat panel displays, organic light emitting diode (OLED) displays exhibit characteristics of self-emission, high brightness, wide viewing angle, high response and a simple fabrication process, making them the choice for the next generation of flat panel displays.

According to driving methods, organic light emitting diode (OLED) displays can be divided into two categories: passive matrix light emitting diode (PM-OLED) and active matrix organic light emitting diode (AM-OLED). Active matrix organic light emitting diode (AM-OLED) displays are more commonly used in flat panel display applications.

Conventionally, it is known that a passive matrix organic light emitting diode (PM-OLED) display is driven to display images by XY matrix electrodes, employing sequential line drive. If the number of scan lines is about hundreds, the required instantaneous brightness is several hundreds times the observed brightness. Thus, the corresponding instantaneously passed electrical current becomes several hundreds times the original passed electrical current. Therefore, larger and extreme heat generated result in increased operating temperature of the organic electroluminescent layers. Since the aging rate of organic electroluminescent layers is in direct ratio to the operating temperature thereof, however, the luminescent efficiency and lifetime of the organic electroluminescent device are thereby adversely affected.

The trend in organic electroluminescent display technology is for higher luminescent efficiency and longer lifetime. As a result, an active matrix organic electroluminescent device with thin film transistors is provided to solve the aforementioned problems. The active matrix organic electroluminescent device has panel luminescence with thin and lightweight characteristics, spontaneous luminescence with high luminescent efficiency and low driving voltage, and the advantages of increased viewing angle, high contrast, high-response speed, flexibility and full color. As the need for larger size display devices becomes increasing, higher resolution of the display devices grows, and active matrix organic electroluminescent devices become a major market trend.

The aforementioned AM-OLED devices can reduce current passing through the OLED, thereby preventing overheating generated by electric energy consumed. AM-OLED devices, however, typically use thin film transistors (TFTs) as switch devices through which a large amount of current passes. Since TFT channels are made of semiconductor materials such as amorphous silicon or polysilicon, resistance of the semiconductor materials can cause passing current to be converted into heat, increasing the operating temperature of the OLED device. As the operating temperature increases, for OLEDs with glass transition temperature (Tg) being about 100° C., it is apparent that the brightness of the OLED device depends on the OLED operating temperature. Such dependency directly affects the lifetime of the OLED device. That is, higher operating temperature can cause incremental degradation of the OLED device.

Accordingly, in order to dissipate heat generated by AM-OLED displays, U.S. Pat. No. 6,265,820, the entirety of which is hereby incorporated by reference, discloses a heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device. Furthermore, U.S. Pat. No. 5,821,692, the entirety of which is hereby incorporated by reference, discloses a cover having a rim engaging the supporting substrate is spaced from and hermetically encloses the organic electroluminescent device. A dielectric liquid having benign chemical properties fills the space between the cover and the organic electroluminescent device, providing both an efficient medium for heat transmission and an effective barrier to oxygen and moisture. Both disclosed OLED displays, however, are restricted to strength and thickness requirements. For example, the multi-level thermal dissipation structure increases total thickness of the OLED device. Furthermore, thermal dissipation fins weaken the strength of the OLED device, causing difficulties in assembly.

SUMMARY

Organic light emitting diode displays with thermal dissipation elements and fabrication methods thereof are provided.

The invention provides organic light emitting diode (OLED) displays. An exemplary embodiment of an OLED display comprises substrate having a display area and a peripheral area; an array of pixels disposed in the display area; column and row control circuits disposed in the peripheral area; and at least one thermal dissipation element disposed in the peripheral area coupling each pixel.

The invention further provides methods for fabricating an OLED display. An exemplary embodiment of a method for fabricating an OLED display comprises: providing a substrate having a display area and a peripheral area; forming an array of active devices in the display area, wherein the array of active devices maybe an array of thin film transistors; forming a plurality of thermal dissipation elements in the peripheral area; and forming an array of OLEDs on the substrate corresponding to each active device, and the array of OLEDs is connected to the at least one of the plurality of thermal dissipation elements.

Another exemplary embodiment of methods for fabricating an OLED device comprises: providing a substrate having an array of active devices in a display area; and forming an array of OLEDs on the substrate corresponding to each active device, thereby forming an active matrix OLED pixel array in the display area; wherein the array of OLEDs is simultaneously formed with a plurality of thermal conductive elements and a plurality of thermal dissipation elements in a peripheral area of the substrate contacting the array of OLEDs.

DESCRIPTION OF THE DRAWINGS

Organic light emitting diode displays and fabrication methods thereof will be better understood with reference to the descriptions to be read in conjunction with the accompanying drawings, in which:

FIGS. 1A-1B are schematic views of an embodiment of an AM-OLED display with thermal dissipation elements, wherein FIG. 1B is an enlargement of region A in FIG. 1A.

DETAILED DESCRIPTION

The invention is directed to organic light emitting diode (OLED) displays and fabrication methods thereof. The organic light emitting diode (OLED) display with thermal dissipation elements can efficiently transfer and conduct heat generated by active devices, wherein the active device may be a thin film transistor. The OLED display comprises a substrate having a main area and a peripheral area. A pixel array is positioned in the display area. Column and row control circuits are positioned in the peripheral area. At least one thermal dissipation element is positioned in the peripheral area and thermally connected to the pixel array. Note that the invention provides AM-OLED displays for implementing different features of various embodiments. These are, of course, merely examples and are not intended to be limiting. It should be appreciated by those skilled in the art that other displays, such as PM-OLED displays or self-illuminating displays, could also use the thermal dissipation elements disclosed hereinafter.

Reference will now be made in detail to preferred embodiments of the invention, examples of which are illustrated in the accompanying drawings.

Figure 1A:
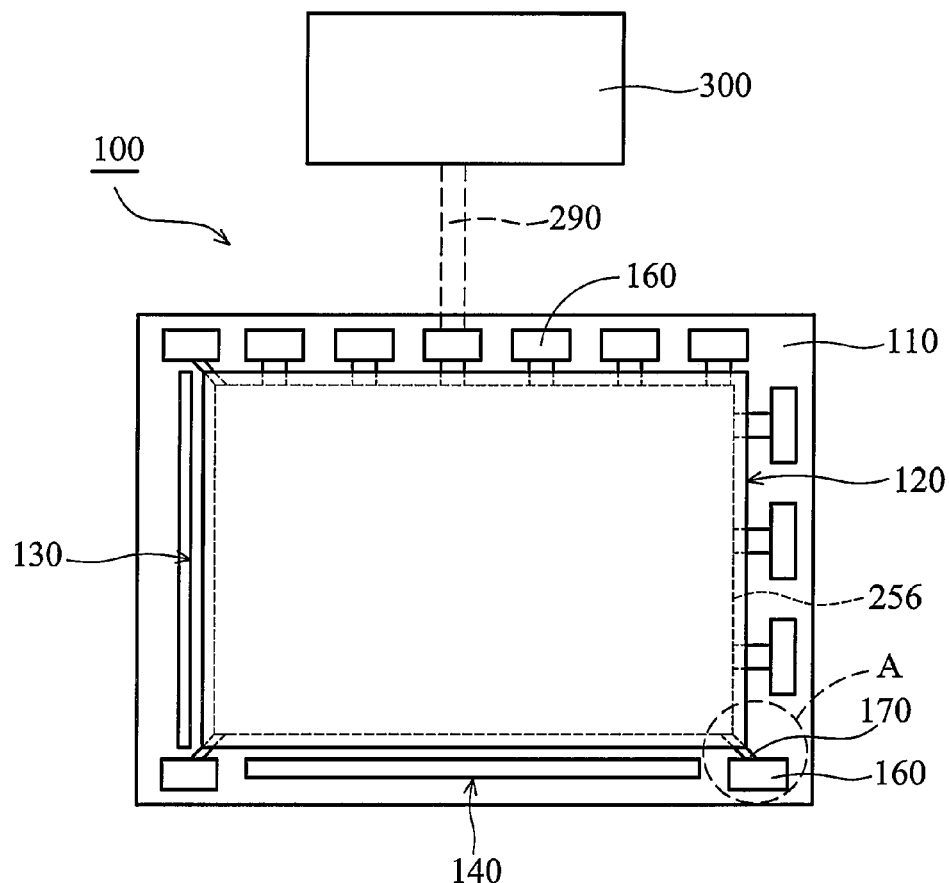
Figure 1B:
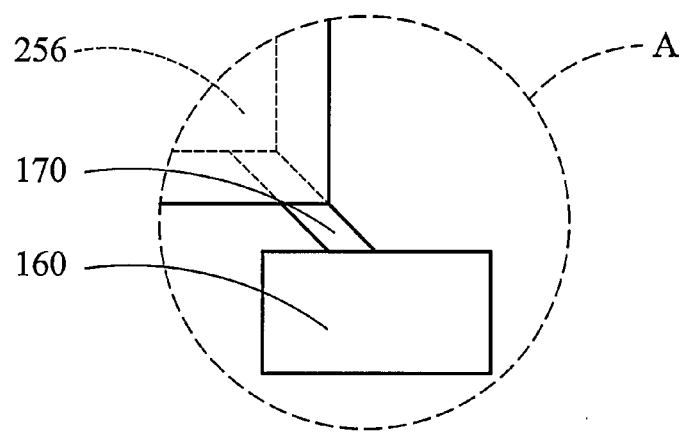

FIG. 1A is plan view of an embodiment of an AM-OLED display with thermal dissipation elements. FIG. 1B is a plan view of an enlargement of region A in FIG. 1A. Referring to FIG. 1A, an AM-OLED display 100 with thermal dissipation elements 160 comprises an array 120 of pixels disposed in a display area of a substrate 110. Column 130 and row 140 control circuits are positioned in the peripheral area. At least one thermal dissipation element 160 is positioned in the peripheral area coupling each pixel 120 by thermal conductive elements 170, for example, thermal conductive lines.

A large scale AM-OLED display 100, for example larger than 7 inches, is driven with high current to reach high brightness. Since large scale AM-OLED display 100 typically employs thin film transistors (TFTs) as driving elements, a large amount of current can pass through the channel of each TFT, made of semiconductor materials such as amorphous silicon or polysilicon. Therefore, resistance of the semiconductor materials can cause a large amount of current to be converted into heat, thereby increasing the operating temperature of the OLED device. According to some embodiments of the invention, dissipation elements 160 are positioned in the peripheral region of the substrate 110, connecting the pixel array through thermal conductive elements 170, thereby transferring heat generated by active elements out of the AM-OLED display to prevent degradation.

Note that dissipation elements 160 in the peripheral region of the substrate 110 are not the termination of heat transfer. Furthermore, thermal dissipation elements 160 can connect to the ambient environment to further transfer heat thereto. Alternatively, thermal conductive media 290 such as thermal dissipation glue can be applied on the thermal dissipation elements 160, preferably connecting to a dissipation frame 300. The coefficient of thermal conductivity of the thermal conductive media 290 may lower than that of the thermal dissipation element 160 or the thermal conductive element 170.

Figure 2:
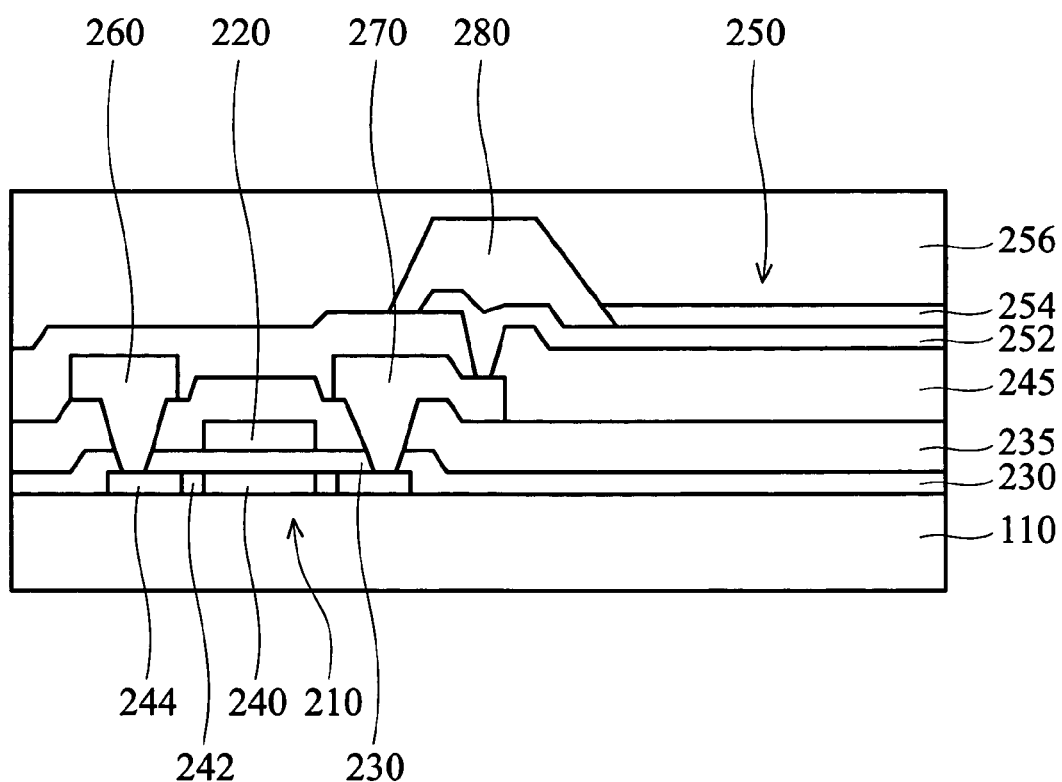
FIG. 2 is a cross section of a pixel region of an AM-OLED display with thermal dissipation elements.

FIG. 2 is a cross section of a pixel region of an AM-OLED display with thermal dissipation elements. The pixel region 1201 comprises a thin film transistor 210 and an organic light emitting diode 250. The thin film transistor 210, preferably low temperature polysilicon thin film transistor (LTPS-TFT), is formed on a substrate 110. The TFT 210 comprises a gate electrode 220, a gate dielectric layer 230, a channel 240, lightly doped drain/source regions 242 formed on lateral sides of the channel 240, and drain/source regions 244. Drain/source regions 244 electrically connect source line 260 and drain line 270, separately. The TFT 210 is isolated from the organic light emitting diode 250 with an interlayer dielectric (ILD) 235. Moreover, the source lines 260 associated with scan lines of the display connect to column control circuit 130 and the drain lines connect to an anode 252 of the organic light emitting diode 250.

A passivation layer 245 over the substrate 110, and TFT 210 comprises an opening for connection between drain line 270 and anode 252 of the organic light emitting diode 250.

Organic light emitting diode 250 comprises a first electrode 252, a light emitting layer 254, and a second electrode 256. The second electrode 256 of OLED 250 associated with that of neighboring OLED connect thermal dissipation elements 160 through thermal conductive elements 170. Each OLED 250 is separated from the TFT 210 with a blank layer 280.

Referring to FIG. 2, a transparent conductive electrode 252 is formed on the passivation layer 245 to serve as an anode of the organic light emitting diode 250. The transparent conductive layer 252 can comprise indium tin oxide (ITO), indium zinc oxide (IZO), aluminum zinc oxide (AZO), or zinc oxide (ZnO) formed by sputtering, electron evaporation, thermal evaporation, chemical vapor deposition (CVD), or spray thermal decomposition.

Subsequently, an organic light emitting layer 254 is conformably formed on the transparent electrode 254, and a metal electrode 256 is sequentially formed covering the substrate 110. Transparent electrode 252, organic light emitting layer 254 and metal electrode 256 construct the organic light emitting diode 250. The organic light emitting layer 254 can be oligomer or polymer with single or multiple layers. The oligomer light emitting layer can be formed by thermal evaporation. Alternatively, the polymer light emitting layer can be formed by spin-on deposition, ink jet printing, or screen printing. Metal electrode 256 can comprise calcium (Ca), silver (Ag), magnesium (Mg), aluminum (Al), lithium (Li), or other low work function materials, or combinations thereof, formed by thermal evaporation or sputtering.

Metal electrode 256 is formed simultaneously with a plurality of thermal conductive elements 170 such as thermal conductive lines connecting thermal dissipation elements 160. According to an embodiment of the invention, metal electrode 256, thermal dissipation elements 160, and thermal conductive elements 170 can be formed in the same step. The metal electrode 256 of each OLED associated with that of the neighboring OLED connect the thermal dissipate elements 160 through thermal conductive elements 170.

Accordingly, since AM-OLED displays typically employ thin film transistors (TFTs) 250 as switching elements, a large amount of current can pass through the channel 240 of each TFT 250. The channel 240 is made of semiconductor materials such as amorphous silicon or polysilicon. Therefore, resistance of the semiconductor materials can convert a large amount of current into heat, thereby increasing the operating temperature of the OLED device. For AM-OLED displays, heat generated by active device must effectively be conducted to the ambient environment, wherein the active device may be a thin film transistor. Heat generated by active devices may either transfer upward or downward to poor thermal conductive materials such as silicon oxide (coefficient of thermal conductivity K=10-20 W/mK) and silicon nitride (coefficient of thermal conductivity K=35 W/mK). More specifically, heat transferred upwardly terminates at the cathode of the OLED and downwardly terminates at the substrate, for example glass (coefficient of thermal conductivity K=1.4-2 W/mK). The cathode is typically made of metal comprising Al, Al—Cu alloy, Mg or Mg—Ag alloy with coefficient of thermal conductivity K larger than 160 W/mK. Thus, the best heat transfer path is upwardly through the cathode of the OLED. Accordingly, a plurality of thermal dissipation elements 160 on the peripheral region of the substrate connect to the cathode of the OLED through thermal conductive elements 170, thereby heat transfer is further passed through the ambient environment. The thermal dissipation elements 160 and the thermal conductive elements 170 are preferably about 100 Å thick and 250 μm wide.

Note that dissipation elements 160 can directly connect to the ambient environment to further transfer heat thereto. Alternatively, thermal conductive media 290 such as thermal dissipation glue with coefficient of thermal conductivity K, equal to or larger than 50 W/mK, or between 1 to 5 W/mK, can be applied on the thermal dissipation elements 160, preferably connecting to a dissipation frame 300. Thus, the OLED display with thermal dissipation elements is advantageous by improving thermal dissipation efficiency by 5-8%. The coefficient of thermal conductivity of the thermal conductive element 170 is about equal to or larger than 50 W/mK.

While the invention has been described by way of example and in terms of preferred embodiment, it is to be understood that the inventions is not limited to the disclosed embodiments. To the contrary, it is intended to cover various modifications and similar arrangements (as would be apparent to those skilled in the art). Thus, the scope of the appended claims should be accorded the broadest interpretations so as to encompass all such modifications and similar arrangements.

What is claimed is:

1. An organic light emitting diode (OLED) display, comprising:
    a substrate having a display area and a peripheral area;
    a pixel array disposed in the display area;
    a column and a row control circuits disposed in the peripheral area;
    at least one thermal dissipation element disposed in the peripheral area and connected to the pixel array; and
    a thermal conductive element connected to the at least one thermal dissipation element,
    wherein the pixel array comprises:
        an array of thin film transistors; and
        an array of organic light emitting diodes, each comprising an electrode connected to the thermal conductive element;
    wherein the column circuit and the row control circuit are directly disposed on the substrate.

2. The OLED display as claimed in claim 1, wherein the pixel array is an active matrix OLED array.

3. The OLED display as claimed in claim 1, wherein the coefficient of thermal dissipation element is equal to or larger than 50 W/mK.

4. The OLED display as claimed in claim 1, wherein the at least one thermal dissipation element comprises metal.

5. The OLED display as claimed in claim 4, wherein the at least one thermal dissipation element comprises Al, Al—Cu alloy, Mg, Mg—Ag alloy, or a combination thereof.

6. The OLED display as claimed in claim 1, further comprising a thermal dissipation medium substantially covering the thermal dissipation element.

7. The OLED display as claimed in claim 1, further comprising a frame contacting the thermal dissipation element.

8. The OLED display as claimed in claim 1, further comprising a frame connected to the thermal dissipation element.

9. The OLED display as claimed in claim 1,
    wherein the thermal dissipation element and the column or the row control circuit are not directly connected.

10. An organic light emitting diode (OLED) display, comprising:
    a substrate having a display area and a peripheral area;
    a pixel array disposed in the display area;
    a column and a row control circuits disposed in the peripheral area;
    at least one thermal dissipation element disposed in the peripheral area and connected to the pixel array; and
    a thermal conductive element connected to the at least one thermal dissipation element, wherein the pixel array comprises:
        an array of thin film transistors; and
        an array of organic light emitting diodes, each comprising a first electrode, an organic light emitting layer disposed on the first electrode, and a second electrode disposed on the organic light emitting layer and connected to the thermal conductive element;
    wherein the column circuit and the row control circuit are directly disposed on the substrate.

11. A method for fabricating an OLED display, comprising:
    providing a substrate having a display area and a peripheral area;
    forming an array of active devices in the display area;
    disposing a column and a row control circuits in the peripheral area;
    forming a plurality of thermal dissipation elements in the peripheral area;
    forming an array of OLEDs on the substrate corresponding to each active device and connected to the at least one of the plurality of thermal dissipation elements; and
    forming a thermal conductive element connected to the at least one thermal dissipation element, wherein each OLED of the array of OLEDs comprises an electrode connected to the thermal conductive element;
    wherein the column circuit and the row control circuit are directly disposed on the substrate.

12. The method as claimed in claim 11, wherein the array of active devices is an array of thin film transistors.

13. The method as claimed in claim 11, wherein the coefficient of the thermal dissipation element is equal to or larger than 50 W/mK.

14. The method as claimed in claim 11, wherein forming the array of OLEDs and forming the plurality of thermal conductive elements are performed simultaneously.

15. The method as claimed in claim 11, further comprising forming a thermal dissipation medium covering the thermal dissipation elements.

16. The method as claimed in claim 11, further comprising forming a frame contacting the thermal dissipation elements.

17. The method as claimed in claim 11, wherein forming the array of OLEDs and forming the plurality of thermal dissipation elements are performed simultaneously.

* * * * *